United States Patent
Brodsky (10) Patent No.: US 6,670,222 B1
(45) Date of Patent: Dec. 30, 2003

(54) TEXTURING OF A DIE PAD SURFACE FOR ENHANCING BONDING STRENGTH IN THE SURFACE ATTACHMENT

(75) Inventor: Mark A. Brodsky, Monte Sereno, CA (US)

(73) Assignee: JDS Uniphase Corporation, San Jose, CA (US)

( * ) Notice: Subject to any disclaimer, the term of this patent is extended or adjusted under 35 U.S.C. 154(b) by 138 days.

(21) Appl. No.: 09/772,436

(22) Filed: Jan. 29, 2001

Related U.S. Application Data (62) Division of application No. 09/097,180, filed on Jun. 12, 1998, now abandoned.
(60) Provisional application No. 60/050,068, filed on Jun. 14, 1997.

(51) Int. Cl.[7] .......................... H01L 21/44; H01L 21/48; H01L 21/50
(52) U.S. Cl. ........................................ 438/118; 438/613
(58) Field of Search .................. 438/613, 441, 438/461, 611, 612, 650, 686, 617, 610, 652, 118, 626; 257/622, 623, 684, 690, 711, 712, 714

(56) References Cited

U.S. PATENT DOCUMENTS

| 4,837,130 | A | * | 6/1989 | Ohta et al. .................. 430/321 |
|---|---|---|---|---|
| 5,022,043 | A | * | 6/1991 | Jacobs ......................... 372/95 |
| 5,168,401 | A |   | 12/1992 | Endriz ........................ 359/625 |
| 5,268,978 | A |   | 12/1993 | Po .............................. 385/33 |
| 5,485,481 | A |   | 1/1996 | Ventrudo et al. ............... 372/6 |
| 5,580,466 | A | * | 12/1996 | Tada et al. ...................... 216/3 |
| 5,609,778 | A | * | 3/1997 | Pulaski et al. ......... 219/121.69 |
| 5,696,666 | A |   | 12/1997 | Miles et al. .................. 361/764 |
| 5,708,294 | A |   | 1/1998 | Toriyama ..................... 257/676 |
| 5,715,263 | A |   | 2/1998 | Ventrudo et al. ............... 372/6 |
| 5,804,882 | A | * | 9/1998 | Tsukagoshi et al. ......... 257/783 |
| 6,397,465 | B1 | * | 6/2002 | Akhavain et al. .......... 29/890.1 |

FOREIGN PATENT DOCUMENTS

JP      05090477 A   *   4/1993

OTHER PUBLICATIONS

Chuck Bosnos et al., "Laser Marking", *Advanced Packaging*, Mar./Apr. 1998.

* cited by examiner

*Primary Examiner*—Wael Fahmy
*Assistant Examiner*—Dana Farahani
(74) *Attorney, Agent, or Firm*—Allen, Dyer, Doppelt, Milbrath & Gilchrist, P.A.

(57) ABSTRACT

Laser beam or pulsed output is provided for enhancing the bonding strength between surfaces that are secured together, such as by lamination process or an adhesive, by texturing with a plurality of indentations formed in at least one of the surfaces to be bonded. As an example of this texturing, a fiber gain medium texturing system having a modulated pump or seed semiconductor laser source may be employed for forming a plurality of indentations in the surface of a die attachment pad of a semiconductor die or IC chip carrier. The indentations may be in the form of dimples or grooves. The indentations enhance the bonding strength formed between the chip and the die attachment pad using a die attaching adhesive. Also, the indentations in the die attachment pad provide a way for containment of rapidly expanding gases that formed in the chip carrier package when the package is subjected to high temperatures such as during a solder reflow operation.

14 Claims, 5 Drawing Sheets

TEXTURING OF A DIE PAD SURFACE FOR ENHANCING BONDING STRENGTH IN THE SURFACE ATTACHMENT

REFERENCE TO RELATED APPLICATION

This application is a divisional application from Ser. No. 09/097,180, filed Jun. 12, 1998 now abandoned, and claims priority benefit of prior filed U.S. provisional patent application Serial No. 60/050,068, filed Jun. 14, 1997, which is incorporated herein by its reference.

FIELD OF THE INVENTION

This invention relates generally to texturing of surfaces for improving the bonding strength between two surfaces to be attached together and also to an exemplification thereof in connection with semiconductor die or chip packages for encapsulating a die or chip on a chip carrier with appropriate leadouts for electrical connection, for example, to a printed circuit board (PCB). In particular, the texture indentation of the surface of die attachment pads in such chip carriers is provided to enhance the bonding strength between the die or chip and the die attachment pad surface as well as between the die attachment pad surface and the encapsulating medium employed in package molding applications.

BACKGROUND OF THE INVENTION

While this invention has particular application in texturing of die attachment pads in die or chip carriers in semiconductor or IC packages, it will be appreciated by those skilled in the art that it also has many other applications where surface-to-surface attachment can be enhanced by texturing one or both of the surfaces to be attached. Such surfaces may be attached by means of an adhesive, solder, surface melting, laser welding or attachment, or other possible methods of securement of the surfaces. Other examples, among many such possibilities, are circuit components, including capacitors and resistors, to a surface or circuit board; and attachment or lamination of layered disk surfaces or other layered film surfaces.

As is known in the art, chip carriers, such as in the form of a metal lead frame or plastic carrier, such as a ball grid array (BGA) type package or equivalent overmolded or glob top type chip carriers, provide support and encapsulation of a semiconductor die or chip with appropriate leadouts from the chip for electrical connection to another electronic component, such as a PCB. In these packaged chip carriers, a die attachment pad is provided for supporting and attachment of the die or chip to the carrier usually by means of an adhesive, which is generally of thermally and electrically conductive material. After appropriate wire bonding has been accomplished with leadouts from the chip, the chip carrier is then encapsulated with an epoxy, resin or other molding material to protect the die or chip from the environment, such as from penetration of moisture and atmospheric corrosion, as well as protecting the wire bonded chip from damage. However, due to differences in the coefficient of thermal expansion (CTE) of the materials comprising the chip, the adhesive and the die attachment pad, the chip may become dislodged, detached or delaminated from the die attachment pad due to subsequent high temperature processing, such as the application of the encapsulation material, or high temperature curing of the die attaching adhesive, or from baking the package to remove moisture from the package that has penetrated the encapsulation material, or due to solder reflow applications. In addition to the package being subjected to such high temperature processing, the high temperatures also cause moisture contained within the package as well as other gases that may be present within the package, or possibly generated from the adhesive itself, to rapidly expand causing chip detachment. This particular type of detachment or delamination of the chip from is pad has been referred to as the "popcorn" effect.

The problem of "popcorn" detachment is also discussed in U.S. Pat. No. 5,696,666 to Miles et al. The solution is to eliminate altogether the die attachment pad while providing for lower profile chip carrier package. However, the supporting strength of the carrier pad-to-chip bonding is lost so that minimal package support is left to the side surfaces of the die which may result in die detachment from the lead frame during the subsequent high temperature process to which the package is subjected to, such as solder reflow operations. On the other hand, U.S. Pat. No. 5,708,294 provides a lead frame with a plurality of diagonal slots formed in the die attachment pad for the purpose of enhancing resin flow during the chip carrier encapsulation process. The slots in the die attachment pad enable enabling better resin flow along the bottom of the pad to avoid resin voids and die pad shifting within the lead frame network. However, there is no accommodation for enhancing the bonding strength between the chip and its attachment pad but rather accommodation for the flow of encapsulating resin along the bottom surface of the die attachment pad.

What is needed is an improvement for enhancing the bonding strength between the die or chip and its die attachment pad.

It is an object of this invention to enhance the bonding strength between surfaces of devices or structures to be attached together.

It is another object of this invention to provide enhancement strength between a die or chip and its die attachment pad.

SUMMARY OF THE INVENTION

According to this invention, the foregoing problems are solved by enhancing the bonding strength between surfaces that are to be secured, for example, by lamination or an adhesive, through the provision in at least one of the surfaces a plurality of indentations using a laser output, such as developed from a fiber gain medium texturing system or a YAG laser system. The fiber gain medium is preferred because such a system is modulated by means of the seed or pump laser diode source which is the origin of the system texturing output which provides versatility over YAG systems in the control of pulse power, duration and frequency, which is not altogether possible in YAG laser systems. The particular application for illustration of this invention comprises the texturing of die attachment pad surfaces in die or chip carriers used in semiconductor or IC packages. However, as previously indicated, the utility of this invention has application in other structures where improved surface-to-surface bonding strength is desired.

The bonding strength between a die or chip and its die attachment pad of a chip carrier or lead frame by is enhanced texturing the surface of the die attachment pad using a laser texturing system that can be easily pulsed to provide high peak pulses to conveniently ablate the surface of the die attachment pad. Such a laser texturing system in the form of a fiber gain medium, seeded or pumped with a modulated laser diode source, conveniently and efficiently provides for variations in the surface size and depth of the indentations. The textured indentations comprise a plurality of dimples or grooves or combinations of different sizes of dimples and/or grooves. While indentations may be formed in the surface of the die attachment pad by means of a stamping or etching step, these type of processing steps are more physically intrusive on the chip carrier in that they can change the alignment of the pad relative to the lead frame framework and otherwise require a processing step that requires die handing of the carrier which may directly effect its integrity. The use of a modulated laser beam or pulsed laser output from a fiber amplifying medium having a master oscillator comprising a pump or seed semiconductor laser diode modulated source provides a controlled pulse output that is significantly less intrusive, less time consuming, and provides a processing step that is not major step in the manufacture and preparation of the chip carrier.

Thus, in accordance with this invention, a semiconductor die or chip carrier comprising a die attachment pad having a die attachment pad surface for receiving a semiconductor chip with the chip bonded to the die attachment pad with an adhesive provides for enhancement of the between the chip and the die attachment pad by forming a plurality of indentations in the die attachment pad surface with a modulated laser output amplified with a fiber gain medium, with the origin of the amplified output provided from a modulated semiconductor laser seed or pump source.

As used herein relative to a master oscillator, such as a seed or pump laser diode, the term "modulated" means a frequency modulated light output to produce a pulsed output at a repetitive rate, and a light output that is turn ON and OFF according to the requirements for texturing, such as the formation of indentations in the form of grooves wherein the output is turn ON and operated cw or at a pulsed rate as the output is scanned at the surface to produce the longitudinal extent of the groove, after which it is turn OFF. This is referred to as article marking or texturing by means of a fiber amplifying system that provides power-on-demand.

Other objects and attainments together with a fuller understanding of the invention will become apparent and appreciated by referring to the following description and claims taken in conjunction with the accompanying drawings.

DETAILED DESCRIPTION OF THE PREFERRED EMBODIMENTS OF THE INVENTION

Other fiber gain medium beam or pulsed output applications, for what is referred to generally as "material processing", have been disclosed by the assignee herein as set forth in U.S. patent application entitled, "PULSED SEMICONDUCTOR LASER HIGH POWER AMPLIFIER SYSTEM", Ser. No. 08/819,950, filed Mar. 18, 1997, now U.S. Pat. No. 6,151,338, issued Nov. 21, 2000, which is incorporated herein by its reference. A particular material processing application in this U.S. patent application is directed to hard disk surface texturing utilizing a pulsed two stage fiber amplifier system, shown in FIG. 6. The application herein is also directed to surface texturing but for a different application with a different surface type of texturing that entails the formation of comparatively large surface indentations in the form of dimples, troughs or grooves to enhance chip bonding to a die or chip attachment pad of a chip carrier.

Figure 1:
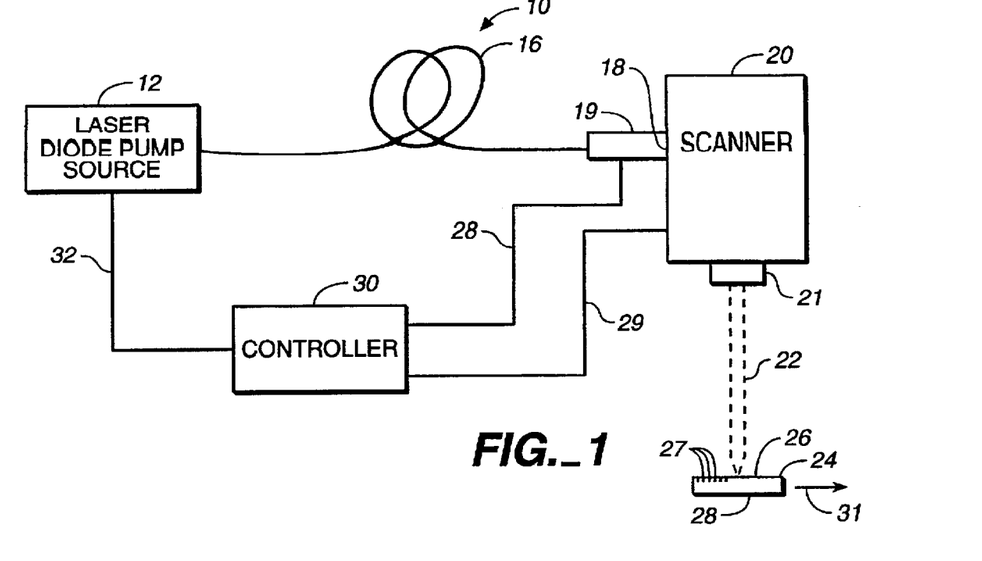
FIG. 1 is a schematic diagram of a first laser texturing system that may be employed in the practice of this invention.

Reference is now made to FIG. 1 which illustrates more detailed of a fiber gain medium texturing system 10 that may be employed in the practice of this invention. The practice of this invention to produce indentations may also be carried out employing a YAG laser system but, for reasons explained herein, fiber gain medium texturing systems are preferred. Specific details of such a system 10 are set forth in U.S. patent application, Ser. No. 09/085,142, filed May 26, 1998, now U.S. Pat. No. 6,160,568, issued Dec. 12, 2000, which is assigned to the assignee herein and incorporated herein in its entirety by its reference. Laser texturing system 10 comprises semiconductor laser source 12 which may be comprised of a laser diode array, such as SDL Model No. 6460-P6, manufactured by SDL, Inc. of San Jose, Calif., providing a light output of about 17 watts. For higher light output, several semiconductor laser bars having multiple light emitters may be combined, such as through employment of a turning mirror arrangement, to produce a single output comprising as much as 28 W or more of pump output power. Such turning mirror arrangements are illustrated in U.S. Pat. No. 5,168,401 and 5,268,978, both of which are incorporated herein by their reference and the former of which is owned by the assignee herein. These types of devices generally require some cooling to maintain a constant environmental temperature, such as employing a thermal electric cooler as is known in the art.

The output of source 12 is launched into double clad fiber 16 which has a rare earth doped core, such as Yb or co-doped Er:Yb. In order to form a lasing cavity, a mirror is provided at the input end of fiber 16 (not shown) which is coated to be transparent to pump light but is highly reflective at the lasing wavelength of fiber 16. The output end of fiber 16 is highly polished so as to form a partially internal reflecting surface, for example, having a reflectivity of about 4% at the lasing wavelength. Thus, the polished facet and the mirror at fiber input form a lasing cavity for double clad fiber marking laser 16. The output beam from texturing laser 16 is coupled into a tubular housing 19 which includes a lens for connecting the optical output launched from the output end of the fiber. A small portion of the marking output is split off via a beam splitter (not shown), which is fixed within housing 19, and provides optical feedback via line 28 to controller 30 for feedback control of the power to diode laser pump source 12 and, in turn, maintain the optical output of texturing laser 16 at a predetermined intensity level, whether laser diode pump source 12 is operated cw or pulsed. Line 28 may be an optical feedback fiber for directing optical feedback to a photodetector in controller 30 or, alternatively, the photodetector may be in housing 19 and the analog signal derived from the photodetector is provided to controller 30 via a signal line 28.

As indicated above, the output beam from texturing laser 16 is coupled into a tubular housing 19 which includes a lens for collimating the optical output from the output end of fiber 16. Housing 19 provides for the collimating lens and beam splitter to be maintained in fixed relation within the housing. Housing 19 is secured to an end of a portion of the flexible length of fiber 16 comprising the fiber texturing laser, and is detachably secured to an input aperture 18 of scanner 20. Thus, the forward end of this tubular housing is easily mounted on scanner input 18 and, as such, the optical output from laser 16 is continually maintained in proper optical alignment with the scanner input aperture and in continuous alignment with the optical components and the optical path formed within scanner 20. Therefore, no later field adjustments are necessary relative to this alignment relationship.

As a specific example of the operating wavelengths of system 10, semiconductor laser source 12 operates with an emission wavelength within the range of about 900 nm to 930 nm, for example, 915 nm, which is within the absorption band of Yb. Fiber marking laser 16 will operate at a wavelength such as 1100 nm to 1110 nm. The length of fiber for laser 16 is made sufficiently long to provide good depletion of the pump light along the length of the double clad fiber. With the employment of a pump laser, such as SDL Model No. 6460-P6, comprising a laser diode bar with multiple light emitters with a combined 17 W output, power levels as high as of 9 W can be achieved from high power double clad fiber laser 16. If a plurality of stacked laser bars are employed, their combined output as a source 12 would provide about 15 W input pump power to fiber laser 16 resulting in a texturing power output of as much as 28 W. In an already reported configuration, a 13.5 W laser diode pump source 12 operating at a wavelength of 807 nm, produced 5 W of CW single transverse mode output power at 1064 nm from a 45 to 50 meter long double clad, Yb doped fiber. The slope efficiency was 51%, although the overall optical conversion efficiency was only 40% due to losses at the optical interface between source 12 and fiber 16. These conversion efficiencies have, however, been presently improved to 60%. The texturing output in system 10 can be focused to a spot size as small as 1 $\mu$m, but diameters of about 15 $\mu$m or less are adequate for most pad texturing applications.

Two dimensional scanner 20 is a device available in the marketplace, such as Model No. HPM10A optical scan head available from General Scanning, Inc. of Watertown, Mass. The laser texturing output from fiber laser 16 is received at the input aperture of scanner 20 and, through the use of a pair of fast-recovery galvanometer mirrors, one each for the X and Y axes, is scanned in two dimensions. The output beam 22 from scanner 20 may be focused by lens 21 and focused to a spot 23 at the image plane which is the surface 26 of an article 24 to be textured, in the case here a die attachment pad in a semiconductor or IC chip carrier, such as a lead frame, a leadless type carrier, or a ball grid array (BGA) or a peripheral ball grid array (PBGA) or other equivalent overmolded or glob top chip carrier. The working field of scanner 20 at the focal plane at die attachment pad surface may be a square or rectangular that may be varied in size on a side from about 60 nm to about 180 nm depending on the chosen flat-field lens 21 employed at the output of scanner 20. The scanned beam or pulsed output, under the control of controller 30, provides a plurality of textured indentations throughout the surface of die attachment pad 24 by ablating the surface, such as through high power pulses developed via modulation of laser diode pump source 12 by controller 30, which pulses provide a corresponding modulated output from fiber laser 16 providing a series of pulses each with one to several kilowatts of peak power.

Controller 30 for laser texturing system 10 comprises a personal computer that includes conventional circuitry that provide digital signal control to scanner 20 via lines 29. Control functions are standard and known to those skilled in the art for the scanning system and accessible through the computer RS-232 interface using software provided by the scanner manufacturer called PC-MARk™ or PC-MARK MT™ and JOB EDITOR™ as well as machine and user interface software called RJE™, WINLASE™ and WINIC™, available from SDL, Inc. of San Jose, Calif.

An important factor and achievement in texturing system 10 is characterized by a fiber laser that is modulated through its optical pumping source by modulating the pumping source rather than modulation of the optical output beam from the laser source, such as with an acusto-optic modulator employed in YAG laser systems. In FIG. 1, the intensity of the texturing output is controlled for this purpose via light and signal feedback via line 28 to control the current supplied to operate laser source 12. Controller 30 includes control circuitry for receiving a feedback signal on line 28, as previously explained. Controller 30 provides a drive current signal to laser source 12 proportional to the intensity of the optical output from fiber laser 16. The level of the drive signal to pump source 12 is determined by comparing the feedback signal with a reference via a comparator. Such a feedback control is described in the incorporated patent application, Ser. No. 09/085,142.

Figure 2:
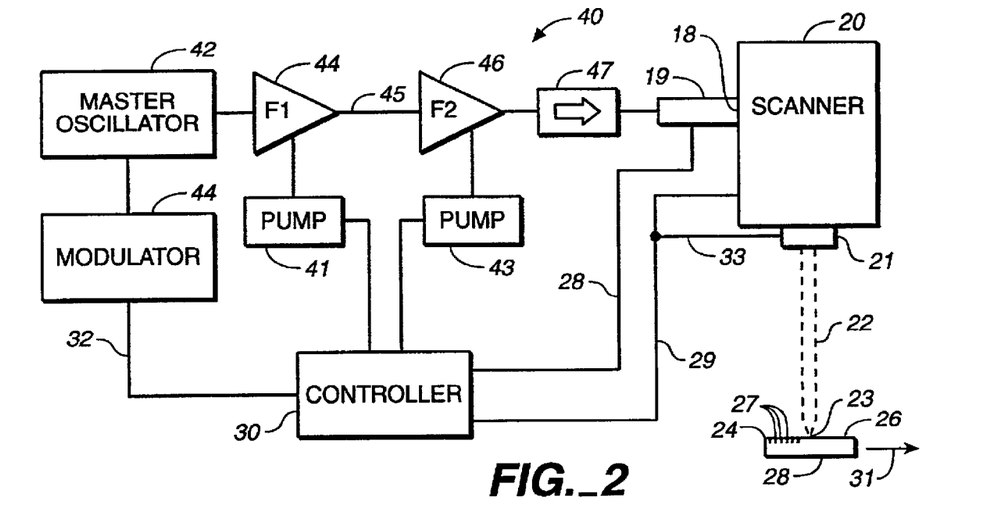
FIG. 2 is a schematic diagram of a second laser texturing system that may be employed in the practice of this invention.

Reference is now made to FIG. 2 illustrating a further embodiment of a fiber gain medium texturing system 40 which may be employed in performing this invention. The primary difference between system 10 in FIG. 1 and system 40 in FIG. 2 is that system 40 entails the employment of fiber amplifiers for developing a texturing pulse optical output. This system provides a higher power output which is better adapted for creating die attachment pad indentations in the performance of this invention, as well be explained in greater detail later.

System 40 comprises a first stage fiber amplifier or pre-amplifier 44, which is preferably a double clad fiber having a rare earth doped core, such as Yb or co-doped Er:Yb, for example. As is known in the art, other rare earth dopants may be employed in the cores of these fibers. Pre-amplifier 44 is pumped with a seed signal from master oscillator 42 of the type as previous explained or may be a grating stabilized Fabry Perot laser such as taught in U.S. Pat. Nos. 5,485,481 and 5,715,263, which are owned by the assignee herein and are incorporated herein by their reference. As an example, source 42 may be a master oscillator operating at 1090 nm which is within the gain band fiber amplifier 44 as well as optically coupled second stage amplifier 46. Source 42 may be modulated via modulator 44 to produce a pulse light output which is optically coupled for launching into first stage fiber amplifier 44. Modulator 44 is controlled by controller 30.

Pre-amplifier 44 is pumped by means of light pump source 41, operating at 915 nm or 975 nm, which are peak wavelengths within the absorption band of Yb. Pump source 41 is coupled to fiber 44 by means of an optical coupler as is well known in the art. The output of pre-amplifier 44 is optically coupled as an input to second stage amplifier or power amplifier 46. Amplifier 46 comprises a double clad fiber with its core doped, for example, with Yb or co-doped Er:Yb. Power fiber amplifier 46 is pumped by means of light pump source 43, operating at 915 nm or 975 nm, which are peak wavelengths within the absorption band of Yb. Pump source 43 is coupled to fiber 46 by means of an optical coupler as is well known in the art. Optionally, power amplifier 44 may be provided with a second pump source (not shown) at its output end and coupled into fiber 44 by means of coupler as is well known in the art.

As is known, an optical isolator may be provided between oscillator 42 and pre-amplifier 44 to prevent any back scattered light or other optical noise from destabilizing the operation of source 42. Also, an isolator may be provided in optical coupling fiber 45 between amplifiers 44 and 46 to suppress ASE developed in power amplifier 44 from entering into pre-amplifier 44. Also, an ASE suppression filter may be employed in fiber 45 to filter out a large portion of ASE developed in pre-amplifier 44 so that this ASE is not amplified in power amplifier 46 along with the peak signal. The foregoing texturing system is also disclosed in patent application, Ser. No. 09/085,142, now U.S. Pat. No. 6,160, 568, issued Dec. 12, 2000, assigned to the assignee herein and incorporated herein by its reference.

In system 40, controller 30 is coupled, via line 32, to modulator 44 for operating master oscillator 42 and is also connected to fiber amplifier pump sources 41 and 43, which may be grating stabilized Farby Perot laser modules as taught in U.S. Pat. Nos. 5,485,481 and 5, 715,263. As previously indicated, controller 30 is also coupled to a photodiode in housing 19 which receives a portion of the optical output from amplifier 46 and provides a feedback signal for controlling the current supplied to master oscillator 42, via modulator 44, to maintain a uniform output intensity from the texturing system. Controller 20 is also connected to operate scanner 20 to adjust the scanner galvanometer mirrors for scanning the die attachment pad surface 26 as master oscillator 42 is modulated to produce an optical output for application to surface 26. Also, controller 30 may be coupled, via lines 33, to focusing lens 21 to adjust the spot size of the optical output from amplifier 46 under the control of controller 30 to form textured indentations 27 of different surface sizes and depths as will be explained in further detail later in connection with FIG. 6.

In operation, master oscillator 12 provides a modulated output of tens of milliwatts and provide a pulsed amplified output at 1090 nm having a peak pulse power output in the range of about 1 kW to about 5 kW with a pulse duration in the range of 10 nsec. to 150 nsec. with a repetition rate of 10 kHz to 1 MHz, more particularly for many applications between 20 kKz to about 200 kHz, producing pulse energy as high as 2.2 mJ. Pulse duration or periods as small as one-half of a nsec. have been achieved with a duty cycle of 50%.

Die or IC chip carriers, such as lead frames, leadless frames, or BGA type carriers and other equivalent over-molded or glob top chip carriers, are acceptable to moisture absorption and to warpage due to CTE differences between the silicon chip and the metal or plastic or metalized plastic die attachment pad. When the packages are subjected to higher temperatures, such as in the case of solder reflow temperatures, the differences in CTE can cause the die to pop off its pad mount. This effect is also referred to as the "popcorn" effect. Also, since the die attaching adhesive has some porosity, the moisture within the carrier package will vaporize, expand and be driven off together with other gases retained in the package, and their rapid expansion can detach or delaminate the die or chip from the die attachment pad. The employment of fiber gain medium supported texturing systems 10 or 40 to form microscopic indentations in the one or more surfaces of the die attachment pad prevents such detachment or delamination. With the application of a highly malleable die attaching adhesive, i.e., one that has a high CTE without reaching its breaking point or a high elastic limit, the bonding strength can be significantly increased between the chip and its support pad.

Figure 3:
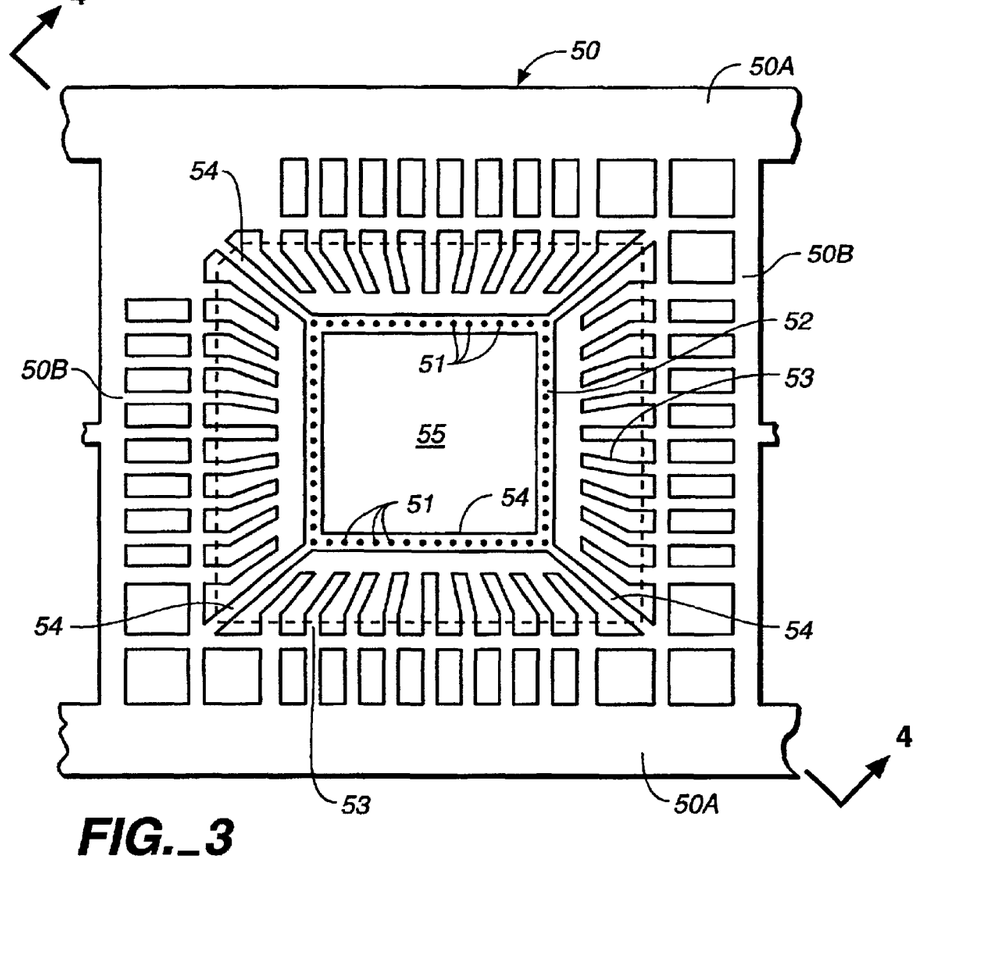
FIG. 3 is a plan view of a conventional chip carrier comprising a lead frame with a textured indentation surface provided on the die attachment pad to enhance the bonding strength between the die or chip and the die attachment pad which is the subject of this invention.
Figure 4:
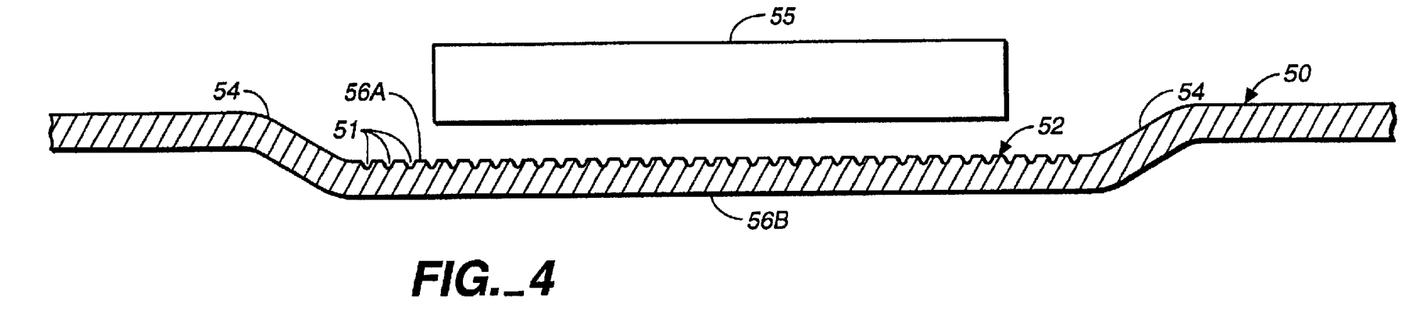
FIG. 4 is a cross-sectional view of the lead frame in FIG. 3 taken along the line 4—4 of FIG. 3.

Texturing systems 10 or 40 are utilized in the practice of this invention to provide improvements in the attachment of integrated circuit or semiconductor die or chips to die attachment pads of chip carriers. One well known type of an IC chip carrier is illustrated in FIGS. 3 and 4, except for the fiber gain medium incorporated indentations shown at 51. As known in the art, an IC chip 55 is fixed to a die attachment pad 52 of a lead frame 50, shown here as a section of lead frame tape. Lead frame 50 is generally formed from a thin metal tape or plate material. A plurality of leads 53 are provided as part of the lead frame 50 to provide connection points, via bonding wires (not shown), between bonding pads (not shown) of IC chip 55 and leads 53.

Die attachment pad 52 of lead frame 50 is supported on the frame by four suspension arms 54, one each at the four corners of the pad. As shown in FIG. 4, the suspended pad 52 is formed at a level offset from the rest of lead frame 50 to accommodate the height of chip 55 and provide for a lower package profile upon resin or epoxy encapsulation of the chip. Lead frame 50 includes in its section a pair of side frame portions 50A, parallel to one another along adjacent sides of the frame. Inner frame portions 50B, extending orthogonal to frame portions 50A, complete the lead frame section. The frame portions 50A and 50B maintain the integrity of lead frame 50 during die attachment, lead bonding and final encapsulation.

As previously indicated, in the past, die or chips 55 have frequently become detached from die attachment pad 52 in spite of good adhesive bonding of the chip 55 to pad 52. This detachment is due to high ambient temperature changes during processing and CTE differences as well as due to entrapped and rapidly expanding gases that both contribute to weakening of the dies attachment bond. Also, the resin compound encapsulating the bottom surface 56B may also become detached over time. I have discovered that these detachments can be solved by the employment of surface texturing with fiber gain medium supported texturing system 10 or 40 to provide texture indentations 51 on an upper surface 56A of die attachment pad 52, that is juxtaposed to or directly faces a bottom bonding surface 55B of chip 55. Textured indentations any also be provided on lower surface 56B of pad 52 in a manner as illustrated in 86 in FIG. 5 in die attachment pad 80, discussed later.

Indentations 53 primarily take the form of dimples in the surface of pad 52, but also be formed troughs or grooves in the pad surface. These dimples are formed such as by employing the texturing system 40 operated in the pulse mode. The size of the dimples that can be formed by system 40 is preferably of a depth of around one-half of the diameter of the diametrical or width extent of the dimples, and these dimples may have a depth in the range of a submicron to about 15 µm.

The surface texturing can be completed over the entire surface 56A within about one second time through orthogonal scanning provided by scanner 20. An important feature of this texturing application employing pulsed fiber amplifiers is that more power can be provided to bring about the required depth of texturing at higher frequencies than can be attempted with any YAG laser system because of the time required to charge up the YAG system and create and complete the up conversion process.

Die or chip 55 is attached to die attachment pad 52 by means of an adhesive which may be thermally and electrically conductive. The adhesive material may be comprised of an epoxy filled with carbon or silver to render it conductive. Other types of adhesives may be employed that have high elastic limits, such as indium containing adhesives, that remain attached to the indentation provided in the pad surface 56A but do not break because of their high elastic limit upon being subjected to high temperatures due to CTE differences between chip 55 and pad 52.

Figure 5:
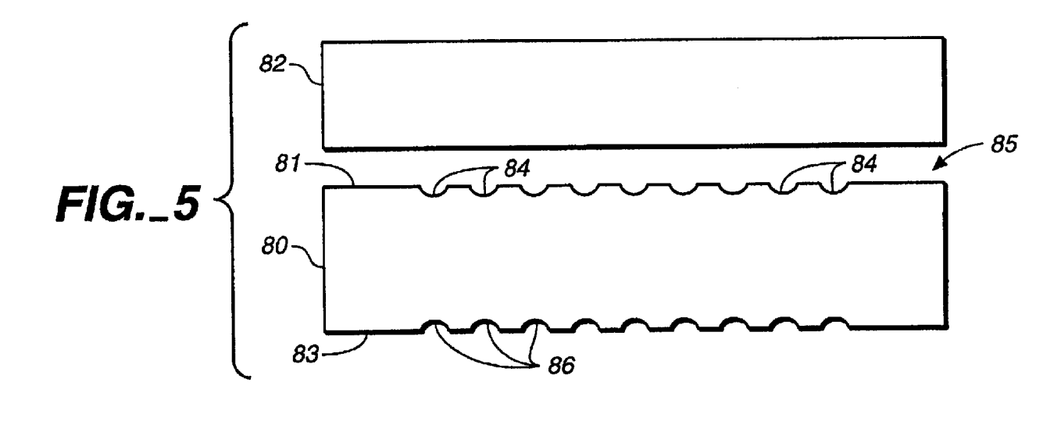
FIG. 5 is side view of a die attachment pad with opposed major surfaces of the pad having texture indentation surfaces.

FIG. 5 shows another view of this invention wherein indentations are formed in a plastic die attachment pad 80. The upper surface 81 of die attachment pad 80 includes indentations 84. Surface 81 may be metalized, as is known in the art, for functioning thermally as a heat spreader and possibly electrically, if necessary, for electrical connection of the chip. Surface 81 receives die or chip 82 and is secured into place with an adhesive provided at 85. Indentations 84 in surface 81 provide for an increase in the bonding strength between chip 82 and die attachment pad 80. Also, the lower or bottom surface 83 of die attachment pad 80 may be provided with indentations 86 which are formed in the same manner as indentations 84. Indentations 86 provide for increased bonding strength between pad 80 and the molding compound encapsulating the chip carrier. With respect to the foregoing, it is to be noted that with the continuing increase in size of IC chips, it is desired also that the die attachment pad also be increased for greater surface bonding over the comparatively larger areas. Thus, improvement of the bonding strength between the underside of the die attachment pad and the encapsulating molding material surrounding the die attachment becomes increasingly important with greater pad size or surface area.

Figure 6:
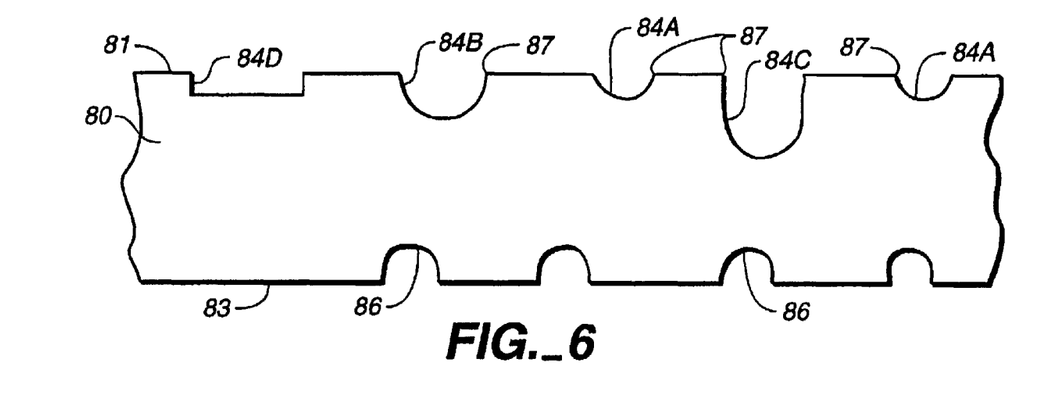
FIG. 6 is an enlarged view of a portion of the die attachment pad of FIG. 6 where the die attachment pad surface is provided with textured indentations of different forms and sizes as well s different depths to further enhance the bonding strength between the die or chip and the die attachment pad.

To be noted in FIG. 5 is that indentations 84 are all of the same relative size. I have discovered further that if these indentations or groups of indentations are of different widths and depths, greater levels of bonding adhesion can be realized. This is illustrated in FIG. 6 wherein the upper die attaching surface 81 of pad 80 is formed with groups of indentations, such as dimples 84A, MB and 84C and troughs 84D. Dimples 84A, MB and 84C have different sizes in diametrical or width extent and depth. The different sizes of these dimples is achieved by variations in the optical pulsed output from system 40. For example, the variations in the diametrical or width extent of the dimples can be changed via the scanner optics, in particular the variation of the focusing optics of lens 21 to vary the spot size of pulsed output 22. Variations in the depth of dimples can be changed via control of the texturing laser energy, via the current supplied to master oscillator 42, and output dwell time, via scanner 20, in the formation of a dimple. The texturing energy in system 40 is controlled by the amount of pump energy that is supplied to amplifiers 44 and 46, particularly power amplifier 46, and the dwell time is determined by the maintained time at a dimple location via the positioning of the galvanometer mirrors in scanner 20. In such a case, master oscillator provides the seed pulse energy to system 40 amplification as well as being modulated to provide texturing pulses of predetermined length and frequency.

In FIG. 6, it can be seen that dimple 84B is wider in diametrical extent and deeper in depth than dimples 84A, whereas dimple 84C has about the same diametrical extent as dimple 84B but is deeper in depth. As previously indicated, the depth of dimples 84A–84C are preferably about one-half of their diametrical extent. While this not true in the case of dimples 84C, an increase in bonding strength is still achieve but the mechanical advantage is not significantly enhanced by the increase in dimple depth into surface 81. The basis behind the rule of dimple depth of about one-half of their diametrical extent is that the sharpest edge 87 that is possible will be provided at the surface of dimples 84A–84C. Sharp edges 87 provided for the best mechanical advantage in enhancing the bonding strength between the die attaching adhesive and the die attachment pad which also translates to enhanced bonding strength of the pad to the chip. In cases where the depth of the dimple is less than about one-half of the diametrical extent of the dimple, it can be realized that edge 87 will not be as sharp in its configuration so that its ability to provide optimum bonding strength with the adhesive will be materially deteriorated. Also, edge 87 does not become any more sharper with the formation of deeper dimples, such as in the case of dimple 84C compared to dimple 81B, but deeper dimples does provide for more surface contact for the adhesive that penetrates into the deeper formed dimples. Also, larger dimples possibly provide for outgassing confinement or pockets into which expanded gases can collect and be retained so as not to affect the integrity of the bond between the die, the die attachment adhesive and the die attachment pad.

As shown in FIG. 6, indentations may also include troughs or grooves 84D in die attachment surface 81 produced by scanning output 21 over surface 81 as master oscillator 42 is modulated via modulator 44 under the control of controller 30. Grooves 84D are also preferably provide with a depth that is around one-half of their width extent. Grooves 84D may be arranged and programmed in controller 30 to be included among dimples 84A–C with different orientations or may be employed exclusively on die attachment surface 81 positioned either in parallel arrays or groups of grooves, or as parallel grooves over the entire pad surface 81, or arranged in an irregular fashion over surface 81. Grooves 84D provide for more continuous edges 87 for enhancing bonding strength as well as providing more space in surface 81 for escaping gases to be contained so as not to affect the integrity of the bond between the die, the die attachment adhesive and the die attachment pad.

Figure 7A:
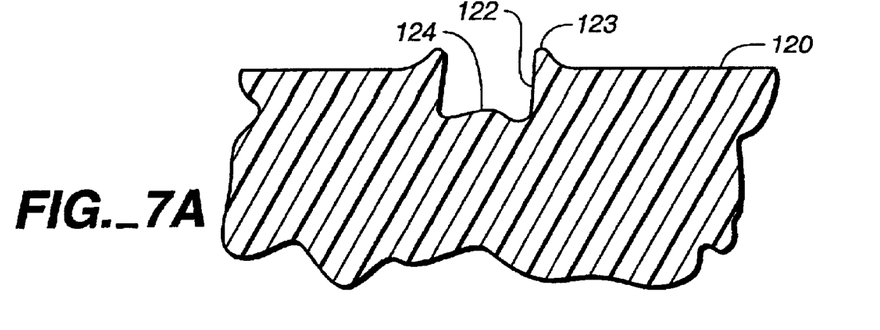
FIGS. 7A, 7B and 7C are enlarged detail views of further examples of the kind of indentation geometry that can be formed according to this invention.
Figure 7B:
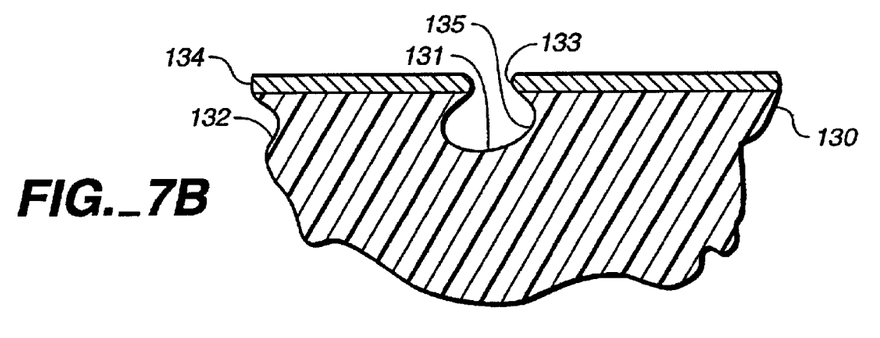
Figure 7C:
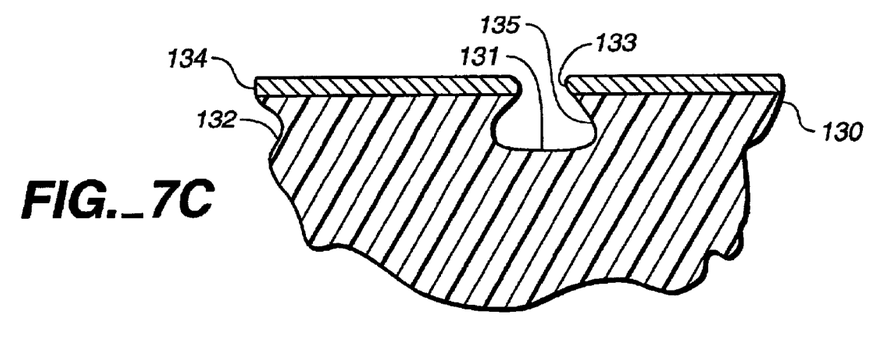

Reference is now made to FIGS. 7A–7C that illustrate other forms of indentations possible with a pulsed fiber gain medium texturing system such as shown in FIG. 2. In these examples, the energy and pulse width of the modulated output from the laser diode source is controlled to some extent to effect the shape, verticality and undercut below the perimeter or edge of the indentation formed in the surface. In FIG. 7A, a material to be textured is shown to be a relatively softer type of material such as a plastic. The textured indentation 122 produce is cause by a high power pulse, such as, for example, in excess of 3 kW peak power and of short time duration. The resulting indentation 12 is effectively blasted into the material resulting in a micro hump 124 in the bottom of the indentation and a micro ridge 123 around its perimeter. These surfaces, particularly ridge 123, provide additional regions for strengthening the adhesion bond between the surface of material 120 and an adjoining surface. FIGS. 7B and 7C provide a different approach in achieving indentations that have undercut regions that significantly aid in providing increased bonding strength between the surfaces of devices to be joined, such as an IC chip and a die attachment pad. Such a device or pad 130 includes a layered of laminated structure comprising a base member 132 and thin top layer 134. Layer 134 is provided to be a stronger or more dense material than member 132. An example is member 132 may be comprised of a plastic or resin material while layer 134 is comprised of a thin metal layer such as sputtered, plated or otherwise deposited copper, Alloy 42™ or Kovar™. Upon application of a pulsed output of high power and short duration, an indentation 131 is formed that provides for a more unusual shape in that the formed indentation 131 is provided with an undercut region 133 beneath its perimeter 133. The aperture formed at perimeter 135 is smaller in diametrical size than that of undercut region 135 because, for a given unit of time, more energy is consumed in removing particles of layer 134 compared to material 132 so that the aperture of the indentation in layer 134 is not as large as the resulting cavity formed beneath the aperture in the softer base member material 132. Such an undercut 135 provides for a significantly enhanced bonding strength in that the adhesive or other such bonding material is provided with means to grasp and hook into the surface of the material 130. The difference in the shape of indentations 131 as shown in FIGS. 7B and 7C is accomplished by changes in pulse energy and pulse duration, particularly with pulses of very short duration, such as in the range of 50 nsec. to 100 nsec. or more, with a duty cycle such as one-tenth of one percent. In such cases, the frequency is generally not less than 20 kHz.

In the foregoing examples, it can be seen that the texture indentations, in the form of dimples and grooves, provide for additional surface geometries on the die attachment surface that increase the bond strength between the die or chip and the die attachment pad without the need for an additional step involving a stamping or etching operation to form the indentations 84 in the surface of the pad to achieve similar effects. Also, it provides for a better bond between the encapsulation material or molding compound and the bottom surface of the die attachment pad where the latter surface is also textured with indentations 86 to provide for surface bonding enhancement with carrier encapsulation material. The textured indentations 84 additionally provide areas for absorption of entrapped gases, preventing the weakening of the die attachment bond or the mechanical link to the encapsulation material. Individual indentations are formed to different depths with different diameters or sizes further enhancing bonding adhesion. Groups of indentations can be formed into an infinite variety of patterns on die attachment pad surfaces comprising individual dimples or elongated grooves. Texturing by indentation overcomes the limitations of employing in-situ stamping or etching of patterns on the die attachment pad during the carrier manufacturing process that provide for a highly intrusive and physically demanding approach on the chip carrier, in particular, resulting in pattern misalignment on the pad and/or bending of the die attachment pad relative to other portions of the chip carrier. Also, these approaches are of greater time consumption, being a major manufacturing step in carrier manufacture, and result in direct physical contact by means of stamping element or a fluid etchant whereas the use of laser energy as a means to form such indentations on a chip carrier is significantly less intrusive, not involving a major manufacturing step and requiring only about one second of time to complete the indentation texturing per pad.

Figure 8:
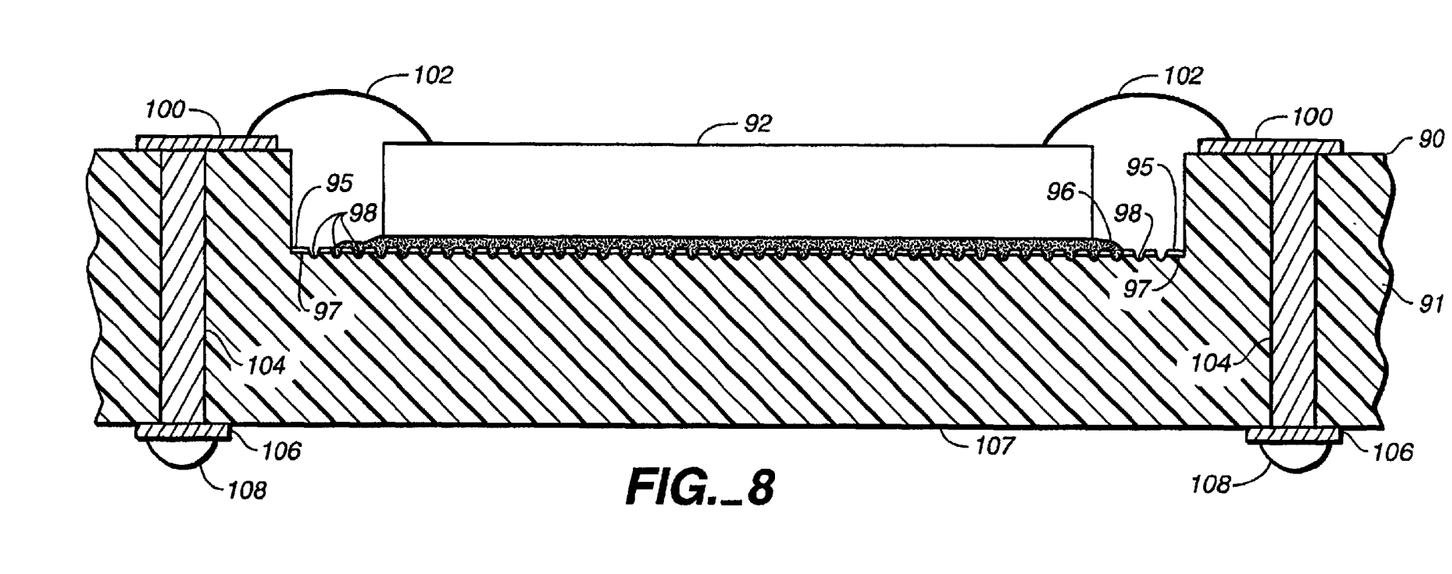
FIG. 8 is a cross-sectional side view of a conventional BGA type of chip carrier with a textured indentation surface provided on the die attachment pad to enhance the bonding strength between the die or chip and the die attachment pad which is the subject of this invention.

The employment of indentation on die attachment pads also provides superior 35 bonding strength for die attachment pads in BGA type carriers and over other molded and glob top chip carriers and the indentations can be generated after the die attachment pad has been plated with a metal layer surface. In this connection, reference is made to the BGA type chip carrier 90 shown in FIG. 8 comprising substrate having an opening 94 into which a die or chip 92 is mounted. The bottom surface 95 of opening 94 may be metalized, as shown at metal layer 97 comprising, for example, copper, Alloy 42™ or Kovar™ for the purposes of heat spreading or possibly electrical connection. Indentations 98 are formed in the bottom pad surface 95 of opening 94 upon which surface 95 the die/chip 92 is to be adhesively affixed, through metal layer 97 by means of texturing systems 10 or 40. The bottom bonding surface 92B of die 92 is juxtaposed to or directly faces the indentations 98 in the bottom pad bonding surface 95 of opening 94, and the die 92 is attached to pad surface 95 by means of thermally conductive adhesive 96. The perimeter of opening 94 includes a plurality of bonding pads or other printed circuitry 100 on the top surface of substrate 91. These bonding pads 100 may be formed over metalized vias that extend through substrate to its bottom surface 107. Wire bonds 102 are formed between chip 92 and pads 100 by a wire bonding machine as is well known in the art. Upon completion of wire bonding, the top surface of substrate 92 is top molded with a resin or other such material to encapsulate the wire bonded chip 92 and protect it from the environment and from damage. The bottom surface 107 of carrier 90 includes printed circuitry 106 and reflowed solder balls 108 for surface attachment of substrate 91 to, for example, a printed circuit board (PCB). The integrity of the chip attachment to die attachment surface 95 is maintained due to the added strength achieved with the texture indentations 98 in pad surface 95.

Although the invention has been described in conjunction with one or more preferred embodiments, it will be apparent to those skilled in the art that other alternatives, variations and modifications will be apparent in light of the foregoing description as being within the spirit and scope of the invention. Thus, the invention described herein is intended to embrace all such alternatives, variations and modifications that may fall within the spirit and scope of the following claims.

What is claimed is:

1. A method of bonding a semiconductor die to an attachment pad therefor comprising the steps of:
   (a) directing a modulated laser output beam onto a plurality of surface regions of a surface portion of said attachment pad, so as to texture said surface portion of said attachment pad with a plurality of indentations; and
   (b) attaching said semiconductor chip to said attachment pad, by an adhesive, which contacts each of a surface portion of said semiconductor chip directly facing said surface portion of said attachment pad and directly facing indentations that have been formed in said surface portion of said attachment pad in step (a).

2. The method according to claim 1, wherein step (a) comprises controlling a modulated laser output beam produced by a fiber gain medium with a modulated pump or seed semiconductor laser source for producing said modulated laser output beam.

3. The method of according to claim 2, wherein step (a) comprises controlling said modulated laser output beam, so as to texture said surface portion of said attachment pad with plural indentations having different characteristics.

4. The method of according to claim 3, wherein step (a) comprises controllably modulating a pulsed fiber amplifier based laser, so that a pulsed laser output beam thereof textures said bonding surface portion of said attachment pad with said plurality of indentations.

5. The method of according to claim 4, wherein step (a) comprises controllably modulating pump energy supplied to said pulsed fiber amplifier based laser.

6. The method of according to claim 5, wherein step (a) comprises controllably modulating at least one of the amount and duration of pump energy supplied to said pulsed fiber amplifier based laser.

7. A method of joining a first workpiece to a second workpiece comprising the steps of:
  (a) directing a modulated laser output beam onto a plurality of surface regions of a bonding surface portion of said first workpiece, so as to texture said bonding surface portion of said first workpiece with a plurality of indentations;
  (b) positioning said second workpiece so that a bonding surface portion thereof is directly facing indentations formed in said bonding surface portion of said first workpiece in step (a); and
  (c) attaching said bonding surface portion of said second workpiece to said bonding surface portion of said first workpiece attachment pad, by an adhesive which bonds said bonding surface portion of said second workpiece with said indentations formed in said bonding surface portion of said first workpiece and directly facing said bonding surface portion of said second workpiece.

8. The method of according to claim 7, wherein step (a) comprises controlling said modulated laser output beam, so as to texture said bonding surface portion of said first workpiece with plural indentations having different characteristics.

9. The method of according to claim 7, wherein step (a) comprises controlling said modulated laser output beam, so as to texture said bonding surface portion of said first workpiece with plural indentations having different widths and depths.

10. The method of according to claim 7, wherein step (a) comprises controlling said modulated laser, output beam, so as to texture said bonding surface portion of said first workpiece with plural indentations having different shapes.

11. The method of according to claim 7, wherein second workpiece comprises a semiconductor chip and said first workpiece comprises an attachment pad for said semiconductor chip.

12. The method of according to claim 7, wherein step (a) comprises controllably modulating a pulsed fiber amplifier based laser, so that a pulsed laser output beam thereof textures said bonding surface portion of said first workpiece with said plurality of indentations.

13. The method of according to claim 12, wherein step (a) comprises controllably modulating pump energy supplied to said pulsed fiber amplifier based laser.

14. The method of according to claim 13, wherein step (a) comprises controllably modulating at least one of the amount and duration of pump energy supplied to said pulsed fiber amplifier based laser.

* * * * *

UNITED STATES PATENT AND TRADEMARK OFFICE
CERTIFICATE OF CORRECTION

PATENT NO.    : 6,670,222 B1
DATED         : December 30, 2003
INVENTOR(S)   : Brodsky It is certified that error appears in the above-identified patent and that said Letters Patent is hereby corrected as shown below:

<u>Column 7,</u>
Line 35, insert the following paragraph:

-- An optical isolator 47 may be employed at the output of power amplifier 46 for the purpose of preventing reflections of the texturing output, developed at the die attachment surface, from being fed back into power amplifier 46 via scanner 20. Not only is this reflected feedback detrimental to the operation of fiber amplifier 46 but it may also be of a sufficient magnitude to destroy the fiber amplifier. --

<u>Column 14,</u>
Line 12, "laser, output beam" should be -- laser output beam --

Signed and Sealed this

Fourth Day of May, 2004

JON W. DUDAS
*Acting Director of the United States Patent and Trademark Office*